United States Patent [19]

Josquin

[11] Patent Number: 4,988,633
[45] Date of Patent: Jan. 29, 1991

[54] METHOD OF MANUFACTURING A SEMICONDUCTOR BI-CMOS DEVICE

[75] Inventor: Wilhelmus J. M. J. Josquin, Eindhoven, Netherlands

[73] Assignee: U.S. Philips Corporation, New York, N.Y.

[21] Appl. No.: 534,101

[22] Filed: Jun. 6, 1990

[30] Foreign Application Priority Data

Jun. 16, 1989 [GB] United Kingdom ............... 8913904

[51] Int. Cl.$^5$ ................. H01L 21/331; H01L 21/336
[52] U.S. Cl. ........................... 437/34; 437/31; 437/41; 437/57; 437/162; 437/240; 437/982; 357/43
[58] Field of Search .............. 437/57, 56, 58, 59, 437/162, 31, 32, 34, 33, 41, 240, 982; 148/DIG. 11, DIG. 124; 357/43, 59, 34

[56] References Cited

U.S. PATENT DOCUMENTS

| 4,752,589 | 6/1988 | Schaber | 437/31 |
| 4,764,482 | 8/1988 | Hsu | 437/57 |
| 4,902,640 | 2/1990 | Sachitano et al. | 437/57 |

FOREIGN PATENT DOCUMENTS 0250721  1/1988  European Pat. Off. ............... 357/43

OTHER PUBLICATIONS

Yamaguchi, T. et al., *IEEE Transactions on Electron Devices*, vol. 35, No. 8, Aug. 1988, pp. 1247-1256, Cole, B. C., *Electronics*, Feb. 4, 1988, pp. 55-67.

Primary Examiner—Brian E. Hearn
Assistant Examiner—T. N. Quach
Attorney, Agent, or Firm—Paul R. Miller

[57] ABSTRACT

The collector region (20) of a bipolar transistor (T) and a first well region (3) for an insulated gate field effect transistor (IGFET) (P) are formed of one conductivity type at respective first and second device areas (10 and 12) of a semiconductor body (1a). After definition of an insulated gate (9), opposite conductivity type impurities are introduced to form source and drain regions (90 and 91) of the IGFET (P) and at the same time to dope a dopable layer (30) on the first device area (10) to form an opposite conductivity type doped layer (30) for forming an extrinsic base region (40). An insulating layer (50, 51) is then provided to cover the first and second device areas (10 and 12). Impurities for forming an intrinsic base region (41) and emitter region (80) of the bipolar transistor (T) are introduced through an opening (60, 61) in the insulating layer (50, 51) which also serves to mask the IGFET (P) from these impurities.

18 Claims, 4 Drawing Sheets

METHOD OF MANUFACTURING A SEMICONDUCTOR BI-CMOS DEVICE

BACKGROUND OF THE INVENTION

This invention relates to a method of manufacturing a semiconductor device comprising a bipolar transistor and an insulated gate field effect transistor and especially, but not exclusively, to a method of manufacturing a semiconductor device comprising a bipolar transistor and complementary insulated gate field effect transistors (IGFETs), that is a so-called BiCMOS device.

U.S. Pat. No. 4,752,589 describes a method of manufacturing a semiconductor device comprising a bipolar transistor and an insulated gate field effect transistor, which method comprises providing a semiconductor body having, adjacent to one major surface, a collector region of one conductivity type at a first device area and a first well region of the one conductivity type at a second device area, defining an insulated gate on the second device area, introducing impurities to form source and drain regions of the opposite conductivity type in the first well region, providing a layer doped with impurities of the opposite conductivity type on the first device area for forming an extrinsic base region, providing an insulating layer to cover the doped layer, forming an opening through the insulating and doped layers to expose a surface region of the first device area, and introducing impurities for forming an intrinsic base region of the opposite conductivity type and an emitter region of the one conductivity type within the intrinsic base region.

The method described in U.S. Pat. No. 4,752,589 also enables the manufacture in a third device area of an insulated gate field effect transistor of the one conductivity type to enable complementary, that is n-channel and p-channel insulated gate field effect transistors or MOSTs within respective complementary conductivity type well regions, to form a so-called BiCMOS device.

In the specific example described in U.S. Pat. No. 4,752,589, a buried region technology is used with the collector region and the well region of the one conductivity type being formed in an epitaxial layer of the opposite conductivity type and each contacting a respective highly doped buried region of the one conductivity type formed at the surface of the underlying opposite conductivity type substrate.

After definition of the device areas and formation of the collector and well regions, the doped layer and covering insulating layer for providing the extrinsic base region are provided. The opening is then formed by defining a first window through the insulating and doped layers and the impurities for forming the intrinsic base region are implanted. Subsequently, by anisotropically etching a deposited insulating layer, insulating regions are provided on the edges of the doped layer for forming a smaller second window through which the impurities for forming the emitter are introduced. After introduction of the emitter-forming impurities, the introduced impurities are caused to diffuse to form the extrinsic and intrinsic base regions and the emitter region.

In addition in the method described in U.S. Pat. No. 4,752,589, the formation of the complementary insulated gate field effect transistors occurs during the formation of the bipolar transistor. In particular, after introduction of the impurities for forming the intrinsic base region and after the formation of the insulating regions, a thermal oxidation is carried out to provide the gate oxide for the complementary IGFETs. This thermal oxidation results in oxidation enhanced diffusion of the impurities making it difficult to obtain a shallow base profile. In addition, the previous anisotropic, for example plasma, etching adversely affects the quality of the gate oxide. After definition of the insulated gates for the complementary IGFETs, the emitter and collector regions of the bipolar transistor are exposed and a further, in the example described, polycrystalline silicon layer is deposited and patterned to complete the insulated gates and form collector and emitter electrodes. After a first implantation of impurities of the one conductivity, phosphorus ions in the example described, to define the lowly doped drain extension of the n-channel IGFET, further impurities of the one conductivity type, in the example described arsenic ions, are implanted to form the source and drain regions of the n-channel IGFET and to provide the impurities which, after a diffusion or drive-in process, form the emitter region and collector contact so that the same implantation dose and energy is used for the n-channnel source and drain regions and for the emitter region. In addition, of course, the implanted impurities will be subjected to the same drive-in process so that again a compromise has to be reached between the requirements of the bipolar transistor and of the complementary IGFETs.

SUMMARY OF THE INVENTION

It is an object of the present invention to overcome or at least mitigate the above-mentioned disadvantages and problems.

According to the invention, there is provided a method of manufacturing a semiconductor device comprising a bipolar transistor and an insulated gate field effect transistor, which method comprises providing a semiconductor body having, adjacent to one major surface, a collector region of one conductivity type at a first device area and a first well region of the one conductivity type at a second device area, defining an insulated gate on the second device area, introducing impurities to form source and drain regions of the opposite conductivity type in the first well region, providing a layer doped with impurities of the opposite conductivity type on the first device area for forming an extrinsic base region, providing an insulating layer to cover the doped layer, forming an opening through the insulating and doped layers to expose a surface region of the first device area, and introducing through the opening impurities for forming an intrinsic base region of the opposite conductivity type and an emitter region of the one conductivity type within the intrinsic base region, characterised by forming the doped layer by providing a dopable layer on the first device area and then introducing the impurities to form the source and drain regions prior to providing the insulating layer, thereby doping the dopable layer with imPurities of the opposite conductivity type, and by providing the insulating layer to cover the first and second device areas so that the insulating layer masks the second device area from the impurities for forming the intrinsic base and emitter regions.

It should be understood that, as used herein, the term 'intrinsic base region' refers to that part of the bipolar transistor which forms the active base region between the collector and emitter regions while the term 'extrinsic base region' refers to that part of the bipolar transistor which contacts the 'intrinsic base region' typically to facilitate electrical contact to the base region.

In a method in accordance with the present invention, the opening for introduction of the impurities for forming the intrinsic base region and the emitter region is not opened until after formation of the IGFET, enabling the formation of a good quality gate oxide for the IGFET and also avoiding the problems of oxidation enhanced diffusion allowing a shallow base profile to be obtained. Also, the insulating layer serves to mask the IGFET from the impurities for forming the intrinsic base region and emitter region without the need for any additional mask. In addition the formation of the intrinsic base region and the emitter region can be optimised independently of the IGFET. This method should also enable the number of process steps to be minimised or at least reduced.

Complementary IGFETs may be formed to provide a BiCMOS device by providing a second well region of the opposite conductivity type at a third device area adjacent to the one major surface, defining insulated gates on the second and third device areas, introducing impurities with the first and second device areas masked to form source and drain regions of the one conductivity type in the second well region prior to providing the insulating layer, and by providing the insulating layer to cover the third device area so as to mask the third device area from the impurities for forming the intrinsic base and emitter regions.

Preferably, the method further comprises providing the dopable layer on a gate insulating layer and introducing impurities of the one conductivity type into the layer, with the part of the dopable layer on the first device area masked, to form the conductive gate layer(s) of the insulated gate field effect transistor(s).

Generally, the opening may be formed by defining a first window through the insulating and doped layers, providing insulating regions on edges of the doped layer to form a second smaller window, and by introducing the impurities to form the emitter region via the second window, thereby enabling good separation of the emitter region from the extrinsic base region. Generally, the impurities for forming the intrinsic base region are introduced via the first window to facilitate a good connection between the extrinsic and intrinsic base regions. However, the impurities for forming the intrinsic base region may be introduced via the second window, although this may require the use of a coupling base implant prior to formation of the insulating regions as described in IEEE transactions on Electron Devices Volume 35 No. 8 August, 1988 at pages 1247-1255.

A method in accordance with the invention may further comprise forming a relatively thin insulating layer covering the surface region and the edges of the doped layer exposed by the first window prior to implanting the opposite conductivity impurities for forming the intrinsic base region and causing the implanted impurities and impurities in the doped layer to diffuse into the semiconductor body to form the intrinsic and extrinsic base regions prior to introducing the impurities for forming the emitter region. The insulating layer may be provided as an oxide layer, for example a tetra-ethyl-ortho-silicate (TEOS) layer, and a flowable insulating layer, for example a borophosphosilicate glass layer. The relatively thin insulating layer may be formed by causing the flowable insulating layer to flow in a lightly oxidising atmosphere so forming the thin insulating layer and in addition inhibiting any impurities or dopants from the flowable insulating layer from entering the emitter region.

The dopable layer may be formed of any suitable material into which dopants can be introduced and from which the introduced dopants can be caused to diffuse into the underlying semiconductor body. For example, the dopable layer may comprise polycrystalline or amorphous silicon. The dopable layer may also be used to form the conductive gate layer(s) of the IGFET(s), normally the conductive gate layer(s) will be doped with phosphorus while the doped layer will, for an npn transistor, be doped with boron. However, the alignment tolerances required for the masking of the part of the dopable layer on the first device area from the impurities for forming the conductive gate layer(s) should not be critical.

The emitter region may be formed by implantation and then drive-in of the impurities. Alternatively, the emitter region may be formed by depositing a further doped layer, for example a doped polycrystalline silicon layer, and then causing the impurities to diffuse into the semiconductor body via the opening. In this example, contact holes for electrodes for the transistors may then be opened through the further doped layer and the insulating layer and, after deposition and patterning of conductive material to form the electrodes, exposed portions of the further doped layer may simply be removed using the electrodes of the transistors as a mask so that a separate mask is not required.

BRIEF DESCRIPTION OF THE DRAWING

Embodiments of the invention will now be described, by way of example, with reference to the accompanying drawings, in which.

Figure 1:
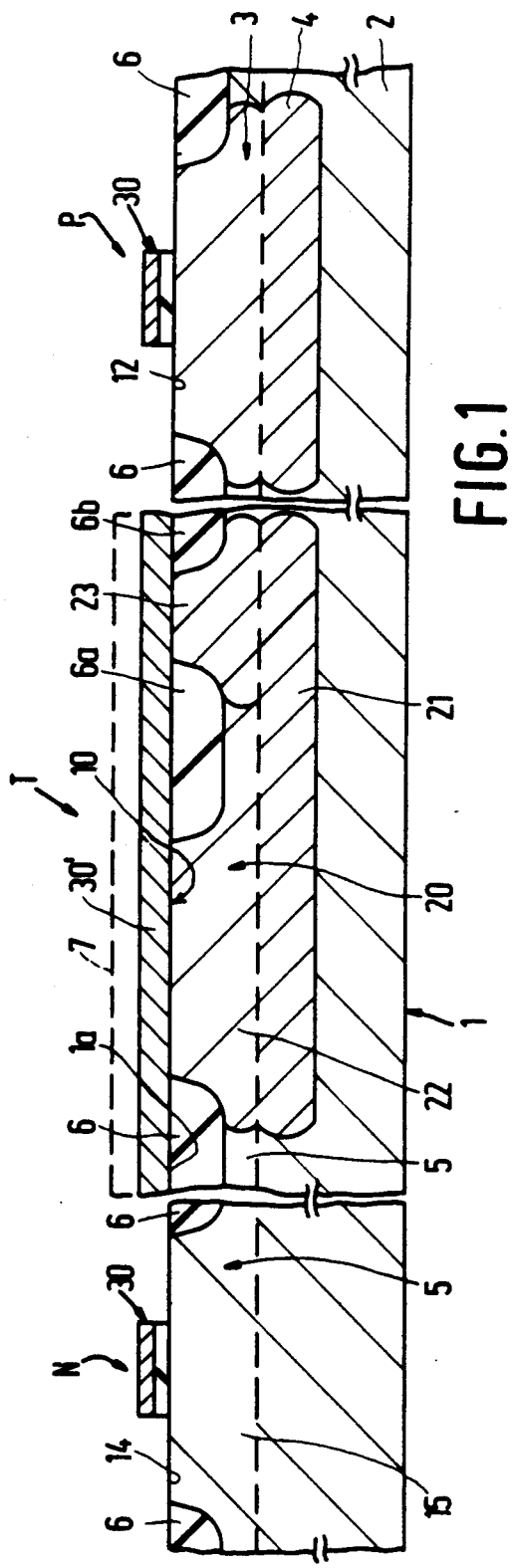
FIGS. 1, 2, 3 and 4 are cross-sectional views of part of a semiconductor body illustrating stages in a method in accordance with the invention for manufacturing a semiconductor device comprising a bipolar transistor and complementary IGFETs.

It should, of course, be understood that the Figures are merely schematic and are not drawn to scale, various dimensions, in particular the thickness of layers and regions, having been relatively exaggerated in the interests of clarity.

DESCRIPTION OF THE PREFERRED EMBODIMENTS

Referring now to the drawings, there is illustrated a method of manufacturing a semiconductor device comprising a bipolar transistor T and an insulated gate field effect transistor P, which method comprises providing a semiconductor body 1 having, adjacent to one major surface 1a, a collector region 20 of one conductivity type at a first device area 10 and a first well region 3 of the one conductivity type at a second device area 12, defining an insulated gate 9 on the second device area 12, introducing impurities to form source and drain regions 90 and 91 of the opposite conductivity type in the first well region 3, providing a layer 31 doped with impurities of the opposite conductivity type on the first device area 10 for forming an extrinsic base region 40 (FIGS. 5 to 7), providing an insulating layer 50,51 to cover the doped layer 31, forming an opening 60,61 through the insulating and doped layers 50 and 31 to expose a surface region of the first device area 10, and introducing through the opening impurities for forming an intrinsic base region 41 of the opposite conductivity type and an emitter region 80 within the intrinsic base region 41.

In accordance with the invention, the method further comprises forming the doped layer 31 by providing a dopable layer 30 on the first device area 10 and then introducing the impurities to form the source and drain regions 90,91 prior to providing the insulating layer 50,51, thereby doping the dopable layer with impurities of the opposite conductivity type, and by providing the insulating layer 50,51 to cover the first and second device areas 10 and 12 so that the insulating layer 50,51 masks the second device area 12 from the impurities for forming the intrinsic base 41 and emitter regions 80.

Thus, the opening for introduction of the impurities for forming the intrinsic base region 41 and the emitter region 80 is not opened until after formation of the IGFET P enabling the formation of good quality gate oxide and avoiding or at least reducing problems of oxidation enhanced diffusion enabling a shallow base profile to be obtained. In addition, the formation of the intrinsic base region 41 and the emitter region 80 can be optimised independently of the IGFETs. Also, because the insulating layer 50,51 serves as the mask to mask the second device area 12 (and thus the IGFET P) from the impurities for forming the intrinsic base region 41 and emitter region 80, no additional masking steps are required, it merely being necessary to form the opening 60,61 to enable completion of the bipolar transistor T.

Such a method may especially be used for the manufacture of a so-called BiCMOS integrated circuit where complementary, that is n-channel and p-channel, insulated gate field effect transistors (IGFETs) N and P are formed in the same semiconductor body, because the method of manufacturing the bipolar transistor involves a minimum number of modifications to the process used for forming the complementary IGFETs. In such circumstances, the method further comprises providing a second well region 15 of the opposite conductivity type at a third device area 14 adjacent to the one major surface 1a, defining insulated gates 8,9 on the second and third device areas 12 and 14, introducing impurities with the first and second device areas 10 and 12 masked to form source and drain regions 93,94 of the one conductivity type in the second well region 15 prior to providing the insulating layer 50,51, and providing the insulating layer 50,51 to cover the third device area 14 so as to mask the third device area 14 from the impurities for forming the intrinsic base 41 and emitter regions 80.

It should, of course, be appreciated that, while the Figures show the manufacture of only a single bipolar transistor T and a single pair of complementary IGFETs N and P, in practice the semiconductor device will comprise many such bipolar transistors T and complementary IGFETs N and P interconnected in conventional manner by metallisation to form the desired circuit.

Turning now to the specific example shown in the drawings, the semiconductor body 1 comprises a monocrystalline silicon substrate 2 of the of the opposite conductivity type, in this example of p-conductivity type, with a resistivity of, typically, 10 ohm–cm into which impurities of the one conductivity type (n-conductivity type in this example) are introduced using an appropriate mask to form at the first device area 10 a first highly doped buried region 21 which will later form part of the collector region 20 of the bipolar transistor T and at the second device area 12 a second highly doped buried region 4 which will later bound a first or n well region 3 for the p-channel IGFET P. A layer 5 (indicated by dashed lines in the Figures) of p-conductivity type silicon with a resistivity of, typically, 8–12 ohm–cm is epitaxially grown on the substrate 2 covering the buried regions 21 and 4.

Using conventional photolithographic and etching techniques, a mask layer (not shown) is then defined and impurities, normally phosphorus ions, are implanted and then caused to diffuse into the epitaxial layer 5 to form n-conductivity type regions immediately above and contacting the buried regions 21 and 4 so that one n-conductivity type region forms the main subsidiary region 22 of the collector region 20 of the bipolar transistor T and the other n-conductivity type region forms a first well region 3 at the second device area 12 and will later form the n well region of the p-channel IGFET P.

The active device areas 10,12,14 of the semiconductor device are then defined or separated by forming field oxide regions 6 using conventional local oxidation of silicon techniques with a silicon oxide-silicon nitride anti-oxidation mask (not shown). A region 15 of the p type epitaxial layer at the third device area 14 is thus bounded by field oxide 6 to define the p-conductivity type well region for the n-channel IGFET N.

At this stage various threshold adjustment implantations may be carried out as is conventional in the art. Also, although not shown in the Figures, as is known in the art, highly conductive channel stopper regions may be formed by ion implantation beneath the field oxide regions 6. As shown in FIG. 1, in addition to dividing the device areas 10,12,14, two of the field oxide regions 6a,6b serve to define a collector contact area 23 which is doped twice with impurities of the one conductivity type, once during formation of the main subsidiary region 22 of the collector region 20 and then again through an appropriate mask to form a highly doped contact area to enable ohmic contact to the collector region 20.

A thin oxide layer is then thermally grown and defined using conventional techniques to provide the gate oxide layer on the second and third device areas 12 and 14. The dopable layer 30 is then deposited over the one major surface 1a as.a layer of nominally undoped, that is not intentionally doped, polycrystalline silicon using conventional low pressure chemical vapour deposition techniques (LPCVD). A non-critical mask (shown in phantom lines in FIG. 1) is then provided over the area 30' of the polycrystalline silicon layer 30 at the first device area 10 and phosphorus ions are then introduced, in this example implanted, into the exposed polycrystalline silicon layer, as is conventional in the art, to render the polycrystalline silicon conductive. The conductive polycrystalline silicon layer and underlying insulating gate oxide are then patterned using conventional photolithographic and etching techniques to define the insulated gates 8 and 9 of the n-channel and p-channel IGFETs N and P having conductive gate layers 33 and 34.

Having formed the structure shown in FIG. 1, a conventional masking layer (not shown) is provided to cover the first and second device areas 10 and 12 leaving the third device area 14 exposed. Using the insulated gate 8 and field oxide regions 6 as a mask, phosphorus ions are introduced into the third device area 14 to form, as is conventional in the art, a lowly doped drain extension region 95 (and also a similar source extension region 96). After removal of this masking layer a thin thermal oxide may be grown and then a layer of silicon oxide is deposited by LPCVD and etched anisotropically, for example in a plasma using a mixture of $CHF_3$, $CF_4$ in argon to expose any underlying silicon region thereby leaving insulating spacer regions 17,18 on the side walls of the insulated gates 8 and 9 of the n and p-channel IGFETs N and P. A further conventional masking layer 101 (FIG. 2) is then provided over the first and second device are as 10 and 12 and further impurities of the one conductivity type, in this example arsenic ions, are introduced, usually by implantation through a very thin or scatter oxide layer (not shown), using the insulated gate 8, spacer regions 17 and field oxide regions 6 as a mask to form the n-conductivity type source and drain regions 93 and 94 of the n-channel IGFET N.

Figure 2:
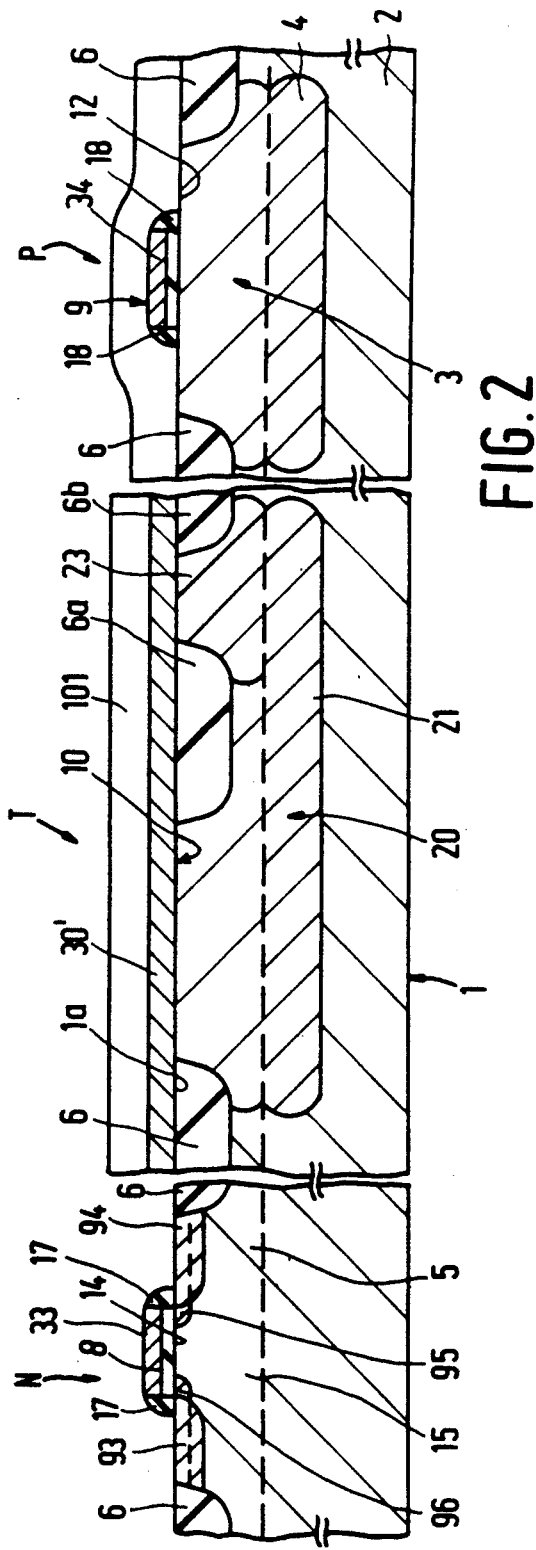

The masking layer 101 shown in FIG. 2 is then removed and a fresh masking layer 102 (see FIG. 3) provided to mask the third device area 14 in which the n-channel IGFET has been formed.

Figure 3:
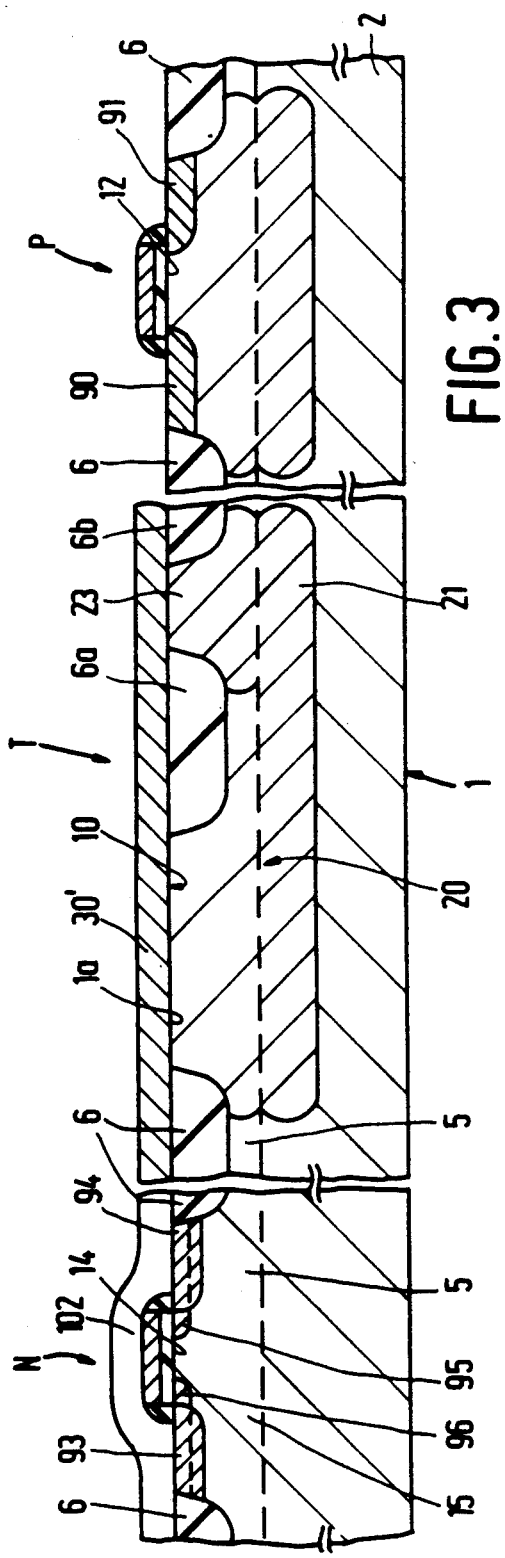

P conductivity type, in this example boron ions, are then implanted into the exposed area 30' of the polycrystalline silicon layer on the first device area 10, and into the first well region 3 using the insulated gate 9, spacer regions 18 and field oxide regions 6 as a mask so as to form the source and drain regions 90 and 91 of the p-channel IGFET P as shown in FIG. 3.

After removal of the masking layer 102, the doped area 30' of the polycrystalline silicon layer 30 on the first device area 10 is patterned using a conventional non-critical mask and conventional etching techniques to define the doped layer 31 by, in particular, removing the polycrystalline silicon from the surface of the collector contact region 23.

Figure 4:
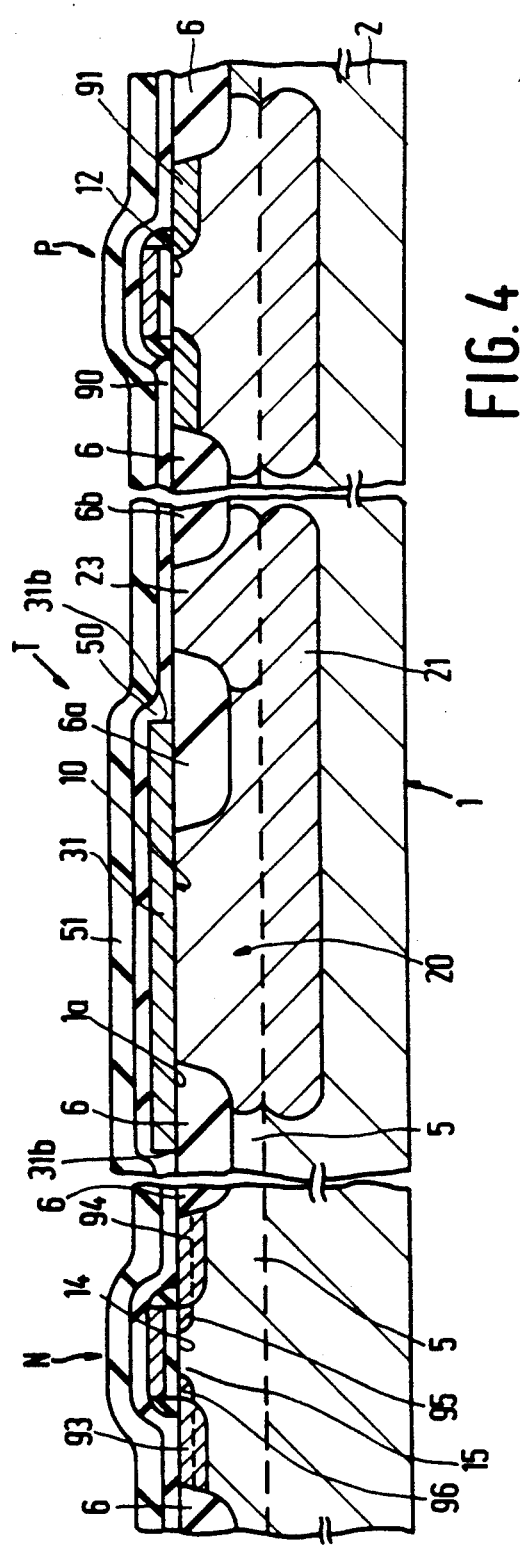

Although in the arrangement shown in the Figures the extent of the doped layer 31 is defined after the introduction of the p-conductivity type impurities, it may be possible to define the undoped layer so that the area 30' of polycrystalline silicon on the first device area 10 does not extend onto the collector contact region 23 but has the physical shape and dimensions shown in FIG. 4 while still undoped. This definition of the undoped polycrystalline silicon area 30' could be carried out either prior to formation of the insulating spacer regions 17,18 or immediately thereafter, using an appropriate mask. In such cases the masking layer 102 should be modified so as to cover the collector contact region 23 and thereby mask that region 23 from the implantation of the p-conductivity type impurities to form the doped layer 31. In these alternative arrangements, after removal of the mask 102 the structure will be similar to that described above after definition of the doped layer 31 (see FIG. 4) but where the undoped area 30' is defined prior to formation of the insulating spacer regions 17,18 similar insulating spacer regions may then be present on the edges 31b of the doped layer 31.

The insulating layer 50 is provided to cover the doped layer 31 and also the remainder of the one major surface including the second and third device areas 12 and 14 containing the n and p-channel IGFETs N and P. In this example the insulating layer 50 is formed of undoped tetra-ethyl-ortho-silicate (TEOS) which may, where the dimensions of the transistors T,P,N are submicron or similar, have a thickness of about 0.2 micrometers. The first insulating layer 50 is covered by a layer 51 of a flowable glassy material, in this example a layer of borophosphosilicate glass (BPSG) which also covers the entire surface.

The insulating layer 50 and covering glass layer 51 serve to protect the complementary IGFETs N and P against subsequent process steps and also assist, as will become evident from the following description, in the formation of the bipolar transistor T.

The use of a flowable layer such as, in this example, a glass layer enables smoothing or planarising of the surface which should help to reduce the aspect ratio of the emitter window. However, other insulating materials may be used or the glass layer 51 may merely be omitted if the insulating layer 50 is sufficiently thick to mask the second and third device areas 12 and 14 (and thus the complimentary IGFETs N and P) from the subsequent process steps to be described below.

After formation of the glass layer 51 by conventional means as shown in FIG. 4, the opening 60,61 is formed as will be described below with reference to FIGS. 5 and 6.

A conventional shadow mask (not shown) is provided on the glass layer 51 so as to define a mask opening through which the glass layer 51, insulating layer 50 and doped layer 31 are to be etched to open the first window 60. In this example, the glass layer 51 may be etched using an isotropic technique to provide a relatively smoothly shaped contour to facilitate later step coverage, although an anisotropic etching process may be used. The insulating layer 50 and doped layer 31 are then sequentially etched using respective conventional anisotropic etching techniques to expose the surface region 11 of the first device area 10 and to provide a good well-defined sharp corner at the edges 31a of the doped layer 31 defining the first window 60 to facilitate formation of insulating regions at the edges 31a will be described below.

Next, the glass layer 51 is caused to flow by heating to about 925 degrees Celsius in a lightly oxidising atmosphere so as to form a relatively thin insulating layer 55 covering the surface region 11 and the exposed edges 31a of the doped layer 31. This heating process also causes boron ions to diffuse out of the doped layer 31 into the collector region 22 to a depth, in this example, of about 0.15 micrometers to form a percursor region 40' which will, after subsequent processing, form the extrinsic base region 40 contacting and surrounding the intrinsic base region 41.

Figure 5:
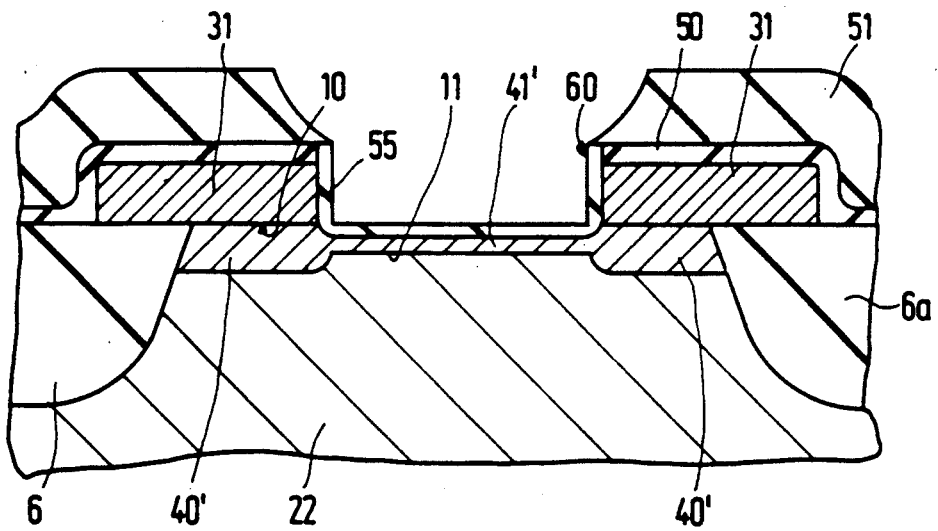
FIGS. 5, 6 and 7 are enlarged cross-sectional views of a portion of the part of the semiconductor body shown in FIGS. 1 to 4 illustrating stages of a method in accordance with the invention of manufacturing a semiconductor device comprising a bipolar transistor and suitable as further steps of the method shown in FIGS. 1 to 4.

The flowing of the glass layer 51 serves to provide a smoother step at the surface of the opening 60,61 as can be seen from FIG. 5 to facilitate subsequent step coverage. This may be particularly useful where, as mentioned above, and anisotropic etching process has been used to etch through the glass layer 51. The thin insulating layer 55 serves to passivate the emitter-base junction in the final transistor T and also to prevent dopant from the borophosphosilicate glass layer 51 reaching the emitter region.

Using the thus-formed first window 60 as a mask window, boron ions are implanted into the surface region 11.

A conventional ion implantation damage anealing treatment may then be carried out at about 875 degrees Celsius. At this stage, as shown in FIG. 5, the implanted boron ions form a precursor region 41' which will eventually provide the intrinsic base region 41. A further insulating layer is deposited, for example a further layer of TEOS or other suitable deposited insulating layer, and is etched anisotropically to expose a smaller surface region 11a of the device area 10 bounded by insulating spacer regions 71 remaining after the anisotropic etching on the edges 31a of the doped layer 31. The insulating spacer regions 71 define the smaller second window 61.

Figure 6:
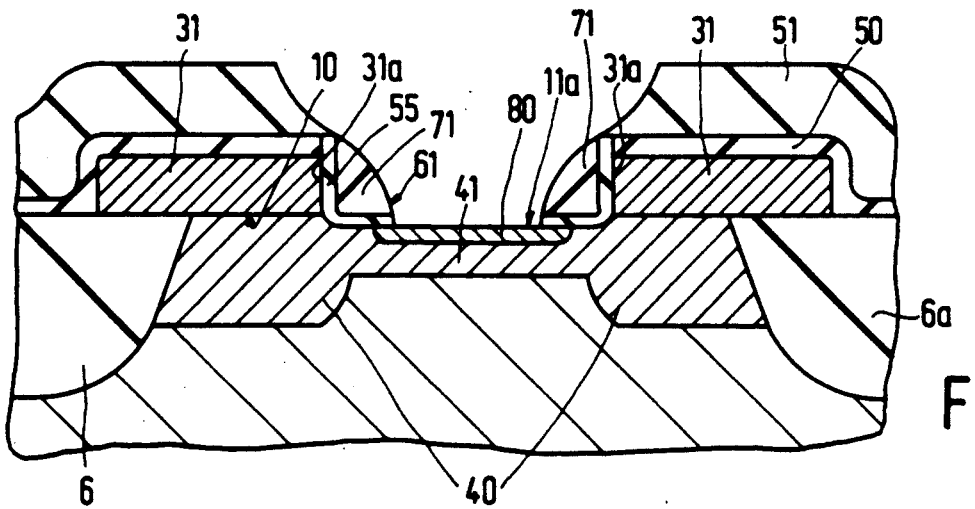

Impurities, for example arsenic ions, may then be implanted via the second window 61 and the semiconductor body 1 subjected to a heat treatment to cause impurities to diffuse to form the extrinisc and intrinsic base regions 40 and 41 and the emitter region 80 within the intrinsic base region 41 as shown in FIG. 6.

Figure 7:
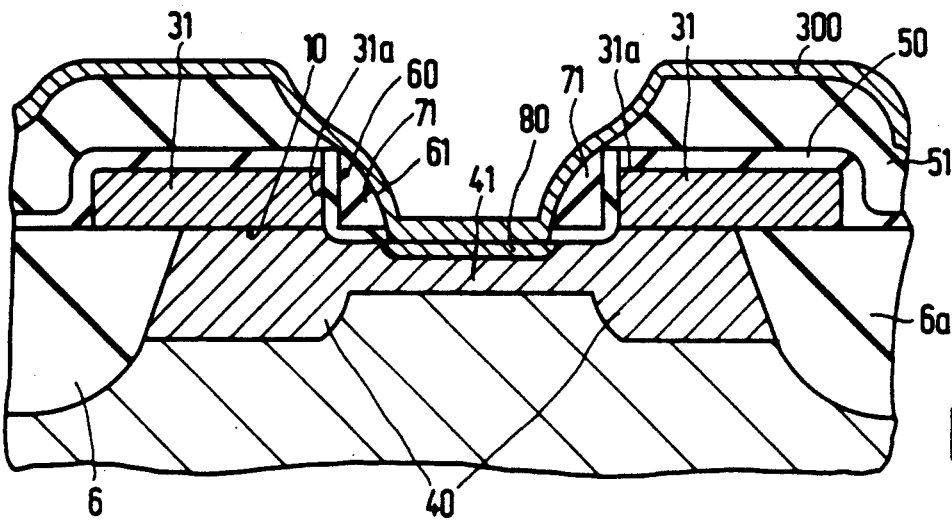

Alternatively, as shown in FIG. 7, a further dopable layer in this example a Polycrystalline silicon layer 300, may be deposited on the glass layer 51 so as to contact the surface area 11a and doped, usually after deposition, with impurities of the one conductivity type, in this example arsenic ions. A conventional rapid thermal annealing (RTA) process of, for example, 10 seconds at 1050 degrees Celsius (so that the duration of the heat treatment is too short to allow dopant or impurities to diffuse from the glass layer 51 via the further doped polycrystalline silicon layer 300 into the emitter region 80) may then be used to cause impurities to diffuse in the semiconductor body to form the intrinsic and extrinsic base regions 40 and 41 and to diffuse from the further doped layer 300 to form the emitter region 80 within the intrinisc base region 41.

Although not shown in FIG. 7, a thin capping layer, for example a silicon oxide layer, may be provided on the further doped layer 300 to prevent loss of dopant impurities to atmosphere during the heat treatment. Any such capping layer will be removed after the heat treatment.

Figure 8:
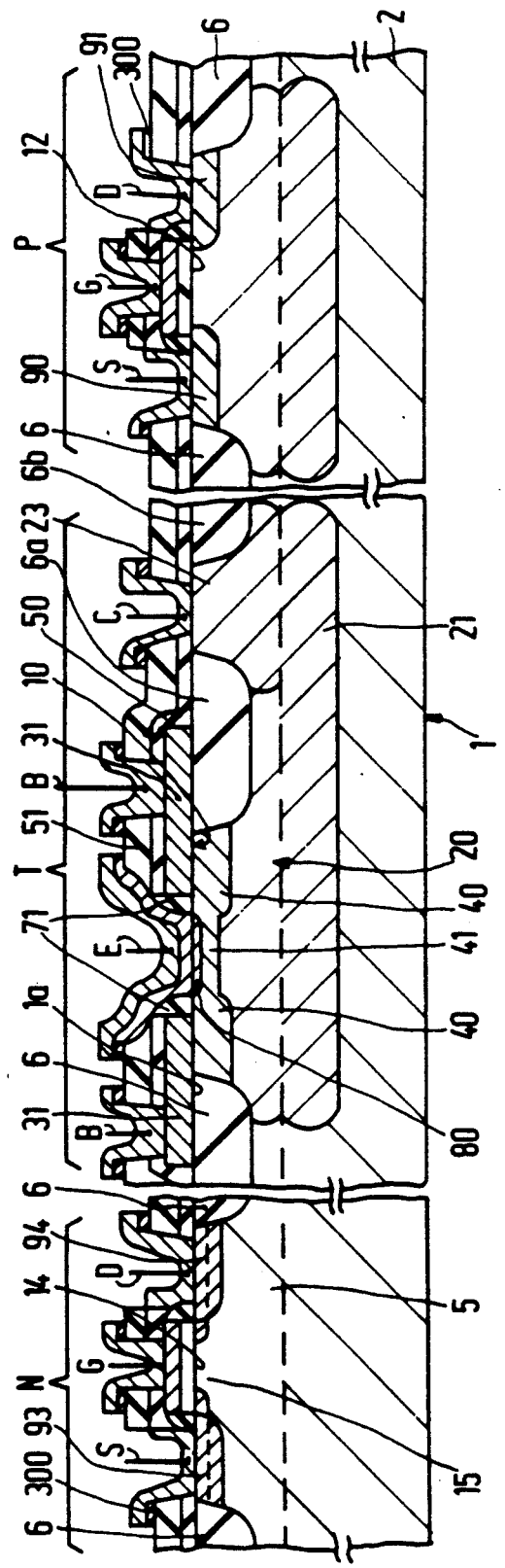
FIG. 8 is a cross-sectional view similar to FIGS. 1 to 4 of a semiconductor device manufactured using a method in accordance with the invention.

After formation of the emitter region 80 as shown in FIG. 6 or 7, a further masking layer (not shown) is applied over the entire surface to enable the opening of contact holes for enabling a first metallisation level to be provided to form contact electrodes for the transistors T,N,P as desired. As will be evident from FIGS. 7 and 8, where the further doped layer 300 is provided, the contact holes are formed by etching first through the further doped, in this example polycrystalline silicon, layer and then the glass layer 51 and insulating layer 50. In order to improve ohmic contact to the metal electrodes, a silicide, for example a cobalt or titanium silicide layer, may be formed in a conventional self-aligned manner on the exposed silicon surface regions after opening of the contact holes.

The metallisation for forming the contact electrodes may be formed by depositing a first layer of a titanium-tungsten alloy and a second layer of silicon-containing aluminium. The metallisation is then patterned using conventional photolithographic and etching techniques to define source S, drain D and gate G electrodes for the n and p-channel IGFETs N and P and emitter E, base B and collector C electrodes for the bipolar transistor T. The exposed portions of the further doped polycrystalline silicon layer 300 (if used) are then removed by conventional techniques using the electrodes E,B,C,S,D,G, etc. as a mask so avoiding the need for any additional masking steps. Further insulating material (not shown) may then be deposited and planarised using well known techniques and vias opened to enable the contact electrodes to be interconnected by a subsequent second (and possibly further) metallisation level to enable formation of the desired circuit.

As should be evident from the Figures, because the intrinsic base and emitter regions 41 and 80 are formed through an opening in the insulating layer 50 and glass layer 51 covering the IGFETs N and P and because the further doped layer 300, if provided, extends over the surface 1a, the contact holes may all be of similar depth thereby facilitating formation of the electrodes by enabling good coverage by the metallisation.

The use of a method in accordance with the invention enables, by virtue of the fact that the window for introducing the impurities to form the intrinsic base and emitter region is not opened until after completion of the complementary IGFETs, a double polycrystalline silicon layer bipolar transistor to be integrated with a minimum number of processing steps additional to those conventionally used for forming CMOS integrated circuits. Moreover, the invention enables the characteristics of the bipolar transistor to be optimised more independently of the CMOS devices.

In the method described above, the intrinsic base region 41 is implanted prior to forming the insulating regions 71 thereby facilitating good connection between the intrinsic and extrinsic base regions 40 and 41. However, it is possible, for example as described in IEEE Transactions on Electron Devices Volume 35 No. 8 August, 1988 at pages 1247–1255 to introduce the impurities for forming the intrinsic base region 41 after formation of the insulating regions 71, for example either by implantation or by implanting first p-conductivity type and later n-conductivity type impurities into the further doped layer 300 so as to form both the intrinsic base region 41 and the emitter region 80 by diffusion from the further doped layer 300. In such a case, it may be necessary, as described in the above-mentioned paper, to include a so-called base coupling implant prior to formation of the insulating regions 71 to ensure good connection between the intrinsic and extrinsic base regions 41 and 40.

Also, the method described above with reference to FIGS. 1 to 4 may be used with other methods for formting the intrinsic base and emitter regions after having opened the first window 60 as described above, this process of forming both a bipolar transistor and complementary IGFETs having the advantage that the implantation dose and energy and drive-in times for the intrinsic base region 41 and emitter region 40 can be controlled independently of the IGFETs because these regions are only formed after completion of the IGFETs.

It should of course be appreciated that, although in the example described above the dopable layers 30 and 300 comprise polycrystalline silicon, other materials could be used. For example it may be possible to use refractory metal silicides in place of or in combination with polycrystalline silicon. Also amorphous silicon could be used in place of polycrystalline silicon.

Also a method embodying the invention may be applied where the conductivity types given above are reversed and where a pnp bipolar transistor is to be manufactured in place of the npn bipolar transistor. Although the method described above is for the manufacture of a BiCMOS device, a method embodying the invention may be used where only one conductivity type IGFET is being formed for example only P conductivity type IGFETs P where the bipolar transistor is an npn transistor.

From reading the present disclosure, modifications or variations will be apparent to persons skilled in the semiconductor art and which may be used instead of or in addition to features already described herein. Although claims have been formulated in this application to particular combinations of features, it should be understood that the scope of the disclosure of the present combination of features disclosed herein either explicitly or implicitly, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A method of manufacturing a semiconductor device comprising a bipolar transistor and an insulated gate field effect transistor, which method comprises providing a semiconductor body having, adjacent to one major surface, a collector region of one conductivity type at a first device area and a first well region of the one conductivity type at a second device area, defining an insulated gate on the second device area, introducing impurities to form source and drain regions of the opposite conductivity type in the first well region, providing a layer doped with impurities of the opposite conductivity type on the first device area for forming an extrinsic base region, providing an insulating layer to cover the doped layer, forming an opening through the insulating and doped layers to expose a surface region of the first device area, and introducing through the opening impurities for forming an intrinsic base region of the opposite conductivity type and an emitter region of the one conductivity type within the intrinsic base region, characterised by forming the doped layer by providing a dopable layer on the first device area and then introducing the impurities to form the source and drain regions prior to providing the insulating layer, thereby doping the dopable layer with impurities of the opposite conductivity type, and by providing the insulating layer to cover the first and second device areas so that the insulating layer masks the second device area from the impurities for forming the intrinsic base and emitter regions.

2. A method according to claim 1, further characterised by forming an insulated gate field effect transistor of complementary conductivity type by providing a second well region of the opposite conductivity type at a third device area adjacent to the one major surface, defining insulated gates on the second and third device areas, introducing impurities with the first and second device areas masked to form source and drain regions of the one conductivity type in the second well region prior to providing the insulating layer, and by providing the insulating layer to cover the third device area so as to mask the third device area from the impurities for forming the intrinsic base and emitter regions.

3. A method according to claim 2, further characterised by forming the opening by defining a first window through the insulating and doped layers, providing insulating regions on edges of the doped layer to form a second smaller window, and by introducing the impurities to form the emitter region via the second window.

4. A method according to claim 3, further characterised by introducing the impurities to form the intrinsic base region via the first window.

5. A method according to claim 4, further characterised by forming a relatively thin insulating layer covering the surface region and the edges of the doped layer exposed by the first window prior to introducing the opposite conductivity impurities for forming the intrinsic base region and causing impurities in the doped layer to diffuse into the semiconductor body for forming the extrinsic base region prior to introducing the impurities for forming the emitter region.

6. A method according to claim 5, further characterised by providing the insulating layer as an oxide layer with a covering of a flowable insulating layer.

7. A method according to claim 6, further characterised by providing the flowable insulating layer as a layer of borophosphosilicate glass.

8. A method according to claim 6, further characterised by forming the relatively thin oxide layer by causing the flowable layer to flow in an oxidising atmosphere.

9. A method according to claim 1, further characterised by also providing the dopable layer on a gate insulating layer and introducing impurities of the one conductivity type into the layer, with the part of the dopable layer on the first device area masked, to form the conductive gate layers of the insulating gate field effect transistor(s).

10. A method according to any one of the preceding claims, further characterised by providing the dopable layer as a silicon layer.

11. A method according to claim 1, further characterised by introducing the impurities for forming the emitter region by implanting the impurities and then causing the introduced impurities to diffuse into the semiconductor body.

12. A method according to claim 1, further characterised by introducing the impurities for forming the emitter region by providing a further doped layer doped with impurities of the one conductivity type in the opening and then causing impurities to diffuse from the further doped layer into the semiconductor body via the opening.

13. A method according to claim 12, further characterised by opening contact holes for electrodes for the transistors through the further doped layer and the insulating layer, depositing and patterning conductive material to form the electrodes and then removing the portions of the further doped layer exposed between the electrodes.

14. A method according to claim 12, further characterized by forming the opening by defining a first window through the insulating and doped layers, providing insulating regions on edges of the doped layer to form a second smaller window, and by introducing the impurities to form the emitter region via the second window.

15. A method according to claim 14, further characterized by introducing the impurities to form the intrinsic base region via the first window.

16. A method according to claim 15, further characterized by forming a relatively thin insulating layer covering the surface region and the edges of the doped layer exposed by the first window prior to introducing the opposite conductivity impurities in the doped layer to intrinsic base region and causing impurities in the doped layer to diffuse into the semiconductor body for forming the extrinsic base region prior to introducing the impurities for forming the emitter region.

17. A method according to claim 1, further characterized by providing the insulating layer as an oxide layer with a covering of a flowable insulating layer.

18. A method according to claim 17, further characterized by providing the flowable insulating layer as a layer of borophosphosilicate glass.

* * * * *